(12) United States Patent
Cherala et al.

(10) Patent No.: US 7,635,263 B2
(45) Date of Patent: Dec. 22, 2009

(54) CHUCKING SYSTEM COMPRISING AN ARRAY OF FLUID CHAMBERS

(75) Inventors: Anshuman Cherala, Austin, TX (US); Byung-Jin Choi, Austin, TX (US); Pankaj B. Lad, DeSoto, TX (US); Steven C. Shackleton, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/690,480

(22) Filed: Mar. 23, 2007

(65) Prior Publication Data

US 2007/0190200 A1 Aug. 16, 2007

Related U.S. Application Data

(63) Continuation-in-part of application No. 11/108,208, filed on Apr. 18, 2005, and a continuation-in-part of application No. 11/047,428, filed on Jan. 31, 2005, and a continuation-in-part of application No. 11/047,499, filed on Jan. 31, 2005.

(60) Provisional application No. 60/788,777, filed on Apr. 3, 2006.

(51) Int. Cl.
*B29C 59/00* (2006.01)
*G03B 27/64* (2006.01)

(52) U.S. Cl. .......................... 425/385; 355/76; 425/397

(58) Field of Classification Search ................ 425/385, 425/387.1, 388, 397; 355/76
See application file for complete search history.

(56) References Cited

U.S. PATENT DOCUMENTS 4,223,261 A 9/1980 White 4,391,511 A 7/1983 Akiyama et al.

(Continued)

FOREIGN PATENT DOCUMENTS

EP 0398589 4/1998

(Continued)

OTHER PUBLICATIONS

Abstract of Japanese Patent 60-127935.

(Continued)

*Primary Examiner*—Maria Veronica D Ewald
(74) *Attorney, Agent, or Firm*—Laura C. Wood

(57) ABSTRACT

The present invention is directed towards a chucking system to hold a substrate, said system including, inter alia, a chuck body having first and second opposed sides, said first side including an array of fluid chambers arranged in rows and columns, said fluid chambers each comprising first and second spaced-apart recesses defining first and second spaced-apart support regions, with said first support region cincturing said second support region and said first and second recesses, and said second support region cincturing said second recess, with said substrate resting against said first and second support regions, with said first recess and a portion of said substrate in superimposition therewith defining a first chamber and said second recess and a portion of said substrate in superimposition therewith defining a second chamber, with each column of said first chambers and each row of said second chambers being in fluid communication with a differing source of fluid to control a flow of fluid in said array of fluid chambers.

20 Claims, 11 Drawing Sheets

U.S. PATENT DOCUMENTS

| | | |
|---|---|---|
| 4,506,184 A | 3/1985 | Siddall |
| 4,512,848 A | 4/1985 | Deckman et al. |
| 4,551,192 A | 11/1985 | DiMilia et al. |
| 4,559,717 A | 12/1985 | Scire et al. |
| 4,731,155 A | 3/1988 | Napoli et al. |
| 4,848,911 A | 7/1989 | Uchida et al. |
| 4,932,358 A | 6/1990 | Studley et al. |
| 4,959,252 A | 9/1990 | Bonnebat et al. |
| 5,028,361 A | 7/1991 | Fujimoto |
| 5,028,366 A | 7/1991 | Harakal et al. |
| 5,110,514 A | 5/1992 | Soane |
| 5,148,037 A | 9/1992 | Suda et al. |
| 5,151,754 A | 9/1992 | Ishibashi et al. |
| 5,240,550 A | 8/1993 | Boehnke et al. |
| 5,259,926 A | 11/1993 | Kuwabara et al. |
| 5,324,012 A | 6/1994 | Aoyama et al. |
| 5,331,371 A | 7/1994 | Mori et al. |
| 5,362,940 A | 11/1994 | MacDonald et al. |
| 5,364,222 A | 11/1994 | Akimoto et al. |
| 5,371,822 A | 12/1994 | Horwitz et al. |
| 5,425,848 A | 6/1995 | Haisma et al. |
| 5,480,047 A | 1/1996 | Tanigawa et al. |
| 5,512,131 A | 4/1996 | Kumar et al. |
| 5,515,167 A | 5/1996 | Ledger et al. |
| 5,534,073 A | 7/1996 | Kinoshita et al. |
| 5,545,367 A | 8/1996 | Bae et al. |
| 5,563,684 A | 10/1996 | Stagaman |
| 5,601,641 A | 2/1997 | Stephens |
| 5,612,068 A | 3/1997 | Kempf et al. |
| 5,669,303 A | 9/1997 | Maracas et al. |
| 5,737,064 A | 4/1998 | Inoue et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,900,062 A | 5/1999 | Loewenhardt et al. |
| 5,923,408 A | 7/1999 | Takabayashi |
| 5,948,470 A | 9/1999 | Harrison et al. |
| 5,956,216 A | 9/1999 | Chou |
| 5,974,150 A | 10/1999 | Kaish et al. |
| 6,019,166 A | 2/2000 | Viswanath et al. |
| 6,046,056 A | 4/2000 | Parce et al. |
| 6,074,827 A | 6/2000 | Nelson et al. |
| 6,137,562 A | 10/2000 | Masuyuki et al. |
| 6,160,430 A | 12/2000 | Drapkin et al. |
| 6,182,510 B1 | 2/2001 | Stanke et al. |
| 6,218,316 B1 | 4/2001 | Marsh |
| 6,220,561 B1 | 4/2001 | Garcia |
| 6,247,579 B1 | 6/2001 | Fujiyama et al. |
| 6,274,294 B1 | 8/2001 | Hines |
| 6,304,424 B1 | 10/2001 | Mett et al. |
| 6,305,677 B1 | 10/2001 | Lenz |
| 6,309,580 B1 | 10/2001 | Chou |
| 6,313,567 B1 | 11/2001 | Maltabes et al. |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,407,006 B1 | 6/2002 | Levert et al. |
| 6,482,742 B1 | 11/2002 | Chou |
| 6,498,640 B1 | 12/2002 | Ziger |
| 6,512,401 B2 | 1/2003 | Clark et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,612,590 B2 | 9/2003 | Coomer et al. |
| 6,621,960 B2 | 9/2003 | Wang et al. |
| 6,646,662 B1 | 11/2003 | Nebashi et al. |
| 6,678,038 B2 | 1/2004 | Binnard |
| 6,696,220 B2 | 2/2004 | Bailey et al. |
| 6,713,238 B1 | 3/2004 | Chou et al. |
| 6,726,195 B1 | 4/2004 | Hertz et al. |
| 6,736,408 B2 | 5/2004 | Olgado et al. |
| 6,759,180 B2 | 7/2004 | Lee |
| 6,762,826 B2 * | 7/2004 | Tsukamoto et al. ........... 355/72 |
| 6,771,372 B1 | 8/2004 | Traber |
| 6,776,094 B1 | 8/2004 | Whitesides et al. |
| 6,809,356 B2 | 10/2004 | Chou |
| 6,809,802 B1 * | 10/2004 | Tsukamoto et al. ........... 355/72 |
| 6,828,244 B2 | 12/2004 | Chou |
| 6,849,558 B2 | 2/2005 | Schaper |
| 6,873,087 B1 | 3/2005 | Choi et al. |
| 6,898,064 B1 | 5/2005 | Berman et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,921,615 B2 | 7/2005 | Sreenivasan et al. |
| 6,932,934 B2 | 8/2005 | Choi et al. |
| 6,936,194 B2 | 8/2005 | Watts |
| 6,946,360 B2 | 9/2005 | Chou |
| 6,951,173 B1 | 10/2005 | Meissl et al. |
| 6,955,767 B2 | 10/2005 | Chen |
| 6,964,793 B2 | 11/2005 | Willson et al. |
| 6,965,506 B2 | 11/2005 | Howald |
| 6,980,282 B2 | 12/2005 | Choi et al. |
| 6,982,783 B2 | 1/2006 | Choi et al. |
| 7,019,819 B2 | 3/2006 | Choi et al. |
| 7,023,238 B1 | 4/2006 | Camarota |
| 7,077,992 B2 | 7/2006 | Sreenivasan et al. |
| 7,117,583 B2 | 10/2006 | Dinan et al. |
| 7,128,875 B2 | 10/2006 | Cubicciotti |
| 7,150,622 B2 | 12/2006 | Choi et al. |
| 7,179,079 B2 | 2/2007 | Sreenivasan et al. |
| 7,224,443 B2 | 5/2007 | Choi et al. |
| 7,245,358 B2 | 7/2007 | Nimmakayala et al. |
| 7,259,833 B2 | 8/2007 | Nimmakayala et al. |
| 7,307,697 B2 | 12/2007 | GanapathiSubramanian |
| 7,406,759 B2 | 8/2008 | Yamamoto |
| 2002/0018190 A1 | 2/2002 | Nogawa et al. |
| 2002/0042027 A1 | 4/2002 | Chou et al. |
| 2002/0069525 A1 | 6/2002 | Hada et al. |
| 2002/0132482 A1 | 9/2002 | Chou |
| 2002/0150398 A1 | 10/2002 | Choi et al. |
| 2002/0167117 A1 | 11/2002 | Chou |
| 2002/0168578 A1 | 11/2002 | Wang et al. |
| 2002/0170880 A1 | 11/2002 | Chen |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0137494 A1 | 7/2003 | Tulbert |
| 2003/0166814 A1 | 9/2003 | Sparrowe et al. |
| 2003/0174435 A1 | 9/2003 | Dinan et al. |
| 2003/0179354 A1 | 9/2003 | Araki et al. |
| 2003/0186140 A1 | 10/2003 | Fries |
| 2004/0036201 A1 | 2/2004 | Chou et al. |
| 2004/0036850 A1 | 2/2004 | Tsukamoto et al. |
| 2004/0046288 A1 | 3/2004 | Chou |
| 2004/0065976 A1 | 4/2004 | Sreenivasan et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0141163 A1 | 7/2004 | Bailey et al. |

| | | |
|---|---|---|
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0250945 A1 | 12/2004 | Zheng et al. |
| 2005/0037143 A1 | 2/2005 | Chou et al. |
| 2005/0046449 A1 | 3/2005 | Davis |
| 2005/0067097 A1 | 3/2005 | Yamamoto |
| 2005/0160934 A1 | 7/2005 | Xu et al. |
| 2005/0264134 A1 | 12/2005 | GanapathiSubramanian et al. |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0172031 A1 | 8/2006 | Babbs et al. |
| 2006/0172549 A1 | 8/2006 | Choi et al. |
| 2006/0172553 A1 | 8/2006 | Choi et al. |
| 2006/0177532 A1 | 8/2006 | Fletcher et al. |
| 2006/0177535 A1 | 8/2006 | McMackin et al. |
| 2007/0114686 A1 | 5/2007 | Choi et al. |
| 2007/0170617 A1 | 7/2007 | Choi et al. |
| 2007/0228589 A1 | 10/2007 | Choi et al. |
| 2007/0243279 A1 | 10/2007 | McMackin et al. |

FOREIGN PATENT DOCUMENTS

| | | |
|---|---|---|
| JP | 57-032629 | 2/1982 |
| JP | 57-153434 | 9/1982 |
| JP | 60-127935 | 7/1985 |
| JP | 1-196749 | 8/1989 |
| JP | 02-24848 | 1/1990 |
| JP | 02-92603 | 4/1990 |
| JP | 02192045 | 7/1990 |
| JP | 4-148549 | 5/1992 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Feldman, Wafer Chuck for Magnification Correction in X-ray Lithography, J. Vac. Sci. Technol. B 16(6), pp. 3476-3479 Nov. 1, 1998.
Chou et al., Imprint of Sub-25 nm Vias and Trenches in Polymers, Appl. Phys. Lett. 67 (21) Nov. 20, 1995.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Colburn et al., Dissertation for the Degree of Doctor of Philosophy, Step and Flash Imprint Lithography: A Low-Pressure, Room-Temperature Nanoimprint Lithography Aug. 1, 2001.
Abstract of Japanese Patent 4-148549.
Abstract of Japanese Patent 57-153434.
Abstract of Japanese Patent 57-032629.
U.S. Appl. No. 11/762,378, naming Inventors McMackin et al., entitled Imprint Lithography Template to Facilitate Control of Liquid Movement, filed Jun. 13, 2007.
Abstract of Japanese patent 02-192045, Jul. 27, 1990.
PCT/US07/07487 ISR, Jun. 4, 2008.
PCT/US06/01160 International Search Report, Jun. 12, 2008.
PCT/US06/01151 International Search Report, Oct. 1, 2008.
PCT/US06/01145 International Search Report; Nov. 14, 2006.
Office Action in U.S. Appl. No. 11/108,208; May 15, 2008.
Office Action in U.S. Appl. No. 11/108,208; Jan. 07, 2009.
Office Action in U.S. Appl. No. 11/047,428; Apr. 05, 2007.
Office Action in U.S. Appl. No. 11/047,428; Sep. 10, 2007.
Office Action in U.S. Appl. No. 11/047,428; Mar. 04, 2008.
Office Action in U.S. Appl. No. 11/047,428; Nov. 4, 2008.
Office Action in U.S. Appl. No. 11/047,499; Jun. 26, 2008.
Office Action in U.S. Appl. No. 11/047,499; Feb. 03, 2009.
Office Action in U.S. Appl. No. 11/108,208; Jun. 16, 2009.

* cited by examiner

CHUCKING SYSTEM COMPRISING AN ARRAY OF FLUID CHAMBERS

CROSS-REFERENCE TO RELATED APPLICATIONS

The present application claims priority to U.S. Provisional Application No. 60/788,777, filed on Apr. 3, 2006, entitled "Imprinting Method by Modulating Wafer Shape," and is a Continuation-in-Part of U.S. patent application Ser. No. 11/047,428, filed on Jan. 31, 2005, entitled "Chucking System for Nano-Manufacturing" which is a divisional patent application of U.S. patent application Ser. No. 11/047,499, filed on Jan. 31, 2005, entitled "Method of Retaining a Substrate to a Wafer Chuck" and a divisional patent application of U.S. patent application Ser. No. 11/108,208, filed on Apr. 18, 2005, entitled "Methods of Separating a Mold from a Solidified Layer Disposed on a Substrate," all of which are incorporated herein by reference.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
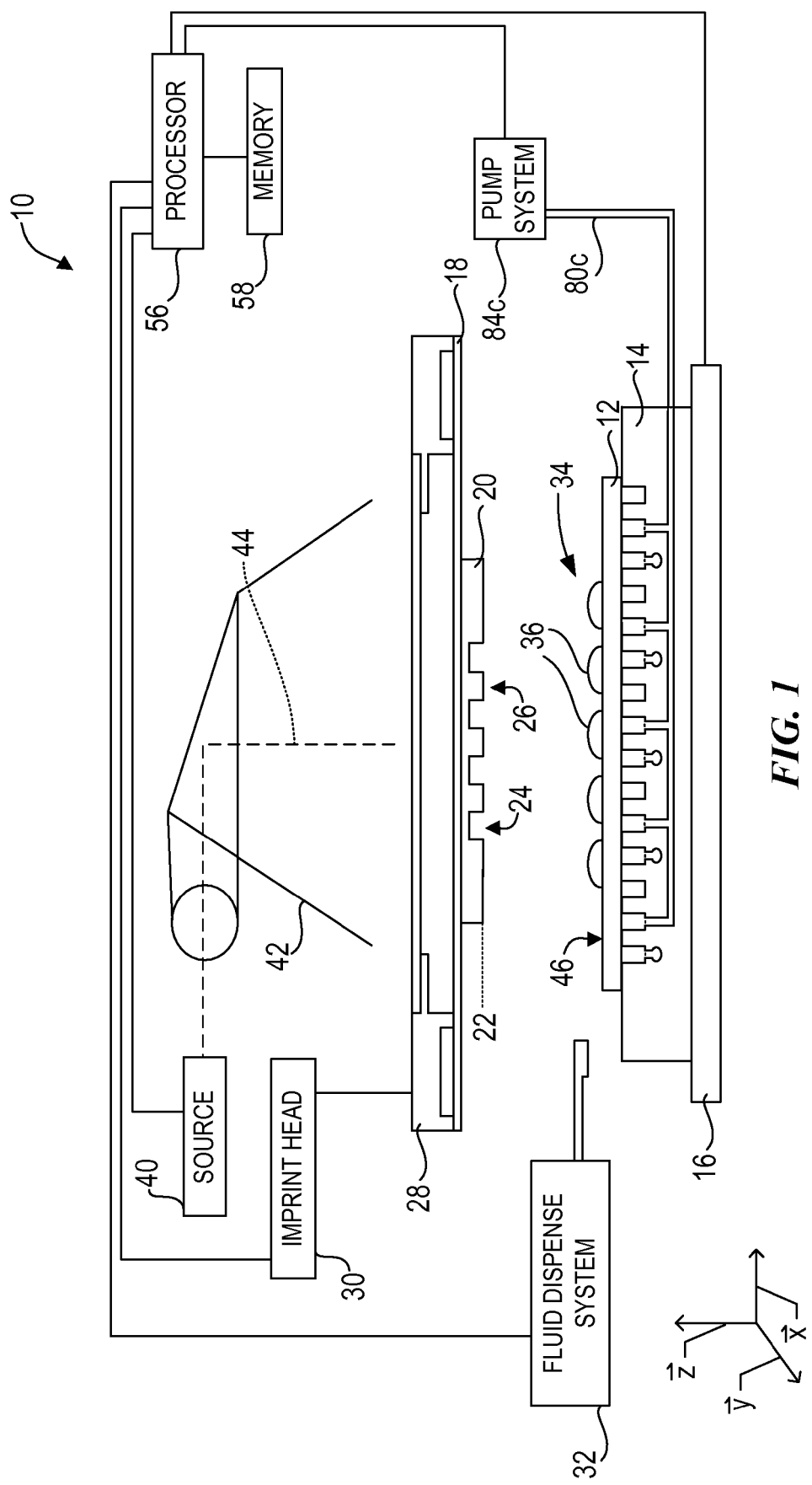
FIG. 1 is a simplified side view of a lithographic system having a mold spaced-apart from a substrate, the substrate positioned upon a substrate chuck.

Referring to FIG. 1, a system 10 to form a relief pattern on a substrate 12 is shown. Substrate 12 may be coupled to a substrate chuck 14, described further below. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having a mesa 20 extending therefrom towards substrate 12 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Template 18 may be coupled to a template chuck 28, template chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes" which is incorporated herein by reference. Further, template chuck 28 may be coupled to an imprint head 30 to facilitate movement of template 18, and therefore, mold 20.

Figure 2:
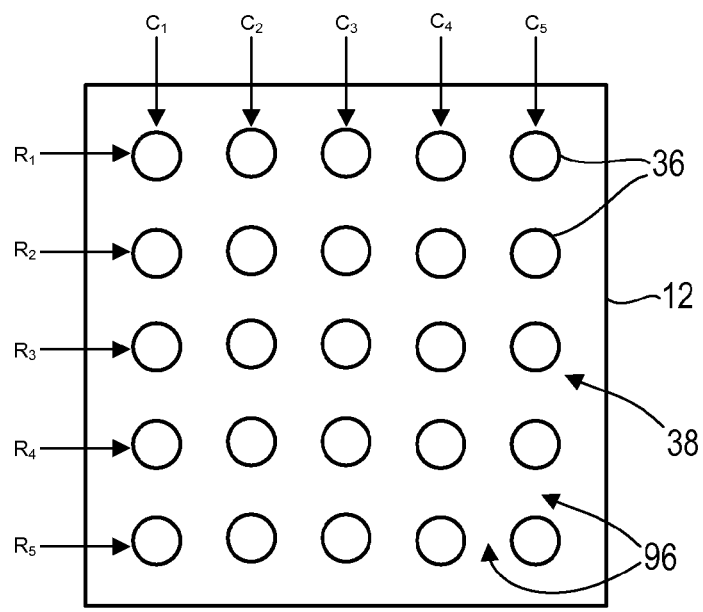
FIG. 2 is a top down view showing an array of droplets of imprinting material positioned upon a region of the substrate shown in FIG. 1.

System 10 further comprises a fluid dispense system 32. Fluid dispense system 32 may be in fluid communication with substrate 12 so as to deposit polymeric material 34 thereon. System 10 may comprise any number of fluid dispensers, and fluid dispense system 32 may comprise a plurality of dispensing units therein. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. As shown in FIG. 2, polymeric material 34 may be deposited upon substrate 12 as a plurality of spaced-apart droplets 36, defining a matrix array 38. In an example, each of droplets 36 may have a unit volume of approximately 1-10 pico-liters. Droplets 36 of matrix array 38 may be arranged in five columns $c_1$-$c_5$ and five rows $r_1$-$r_5$. However, droplets 36 may be arranged in any two-dimensional arrangement on substrate 12. Typically, polymeric material 34 is disposed upon substrate 12 before the desired volume is defined between mold 20 and substrate 12. However, polymeric material 34 may fill the volume after the desired volume has been obtained.

Figure 3:
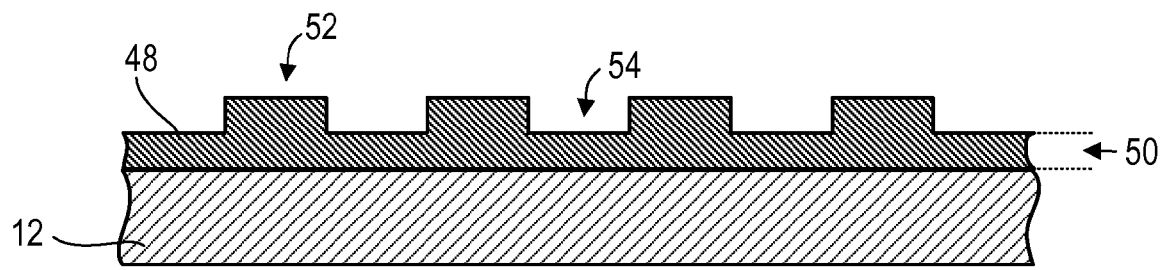
FIG. 3 is a simplified side view of the substrate shown in FIG. 1, having a patterned layer positioned thereon.

Referring to FIGS. 1-3, system 10 further comprises a source 40 of energy 42 coupled to direct energy 42 along a path 44. Imprint head 30 and stage 16 are configured to arrange mold 20 and substrate 12, respectively, to be in superimposition and disposed in path 44. Either imprint head 30, stage 16, or both vary a distance between mold 20 and substrate 12 to define a desired volume therebetween that is filled by polymeric material 34. More specifically, droplets 36 may ingress and fill recesses 24. The time required for droplets 36 to fill the pattern defined by patterning surface 22 may be defined as the "fill time" of mold 20. After the desired volume is filled with polymeric material 34, source 40 produces energy 42, e.g., broadband ultraviolet radiation that causes polymeric material 34 to solidify and/or cross-link conforming to the shape of a surface 46 of substrate 12 and patterning surface 22, defining a patterned layer 48 on substrate 12. Patterned layer 48 may comprise a residual layer 50 and a plurality of features shown as protrusions 52 and recessions 54. System 10 may be regulated by a processor 56 that is in data communication with stage 16, imprint head 30, fluid dispense system 32, and source 40, operating on a computer readable program stored in memory 58.

Referring to FIGS. 1 and 4-6, as mentioned above, system 10 comprises substrate chuck 14. Substrate chuck 14 is adapted to retain substrate 12 employing vacuum techniques. Substrate chuck 14 comprises a chuck body 60 having first 62 and second 64 opposed sides. A side, or edge, surface 66 extends between first 62 and second 64 opposed sides. First side 62 comprises a plurality of fluid chambers 68. As shown, substrate chuck 14 comprises fluid chambers 68$a$-68$u$; however, in a further embodiment, substrate chuck 14 may comprise any number of fluid chambers. As shown, fluid chambers 68$a$-68$u$ may be positioned as an array arranged in five columns $a_1$-$a_5$ and five rows $b_1$-$b_5$. However, fluid chambers 68 may be arranged in any two-dimensional arrangement in chuck body 60. For simplicity of illustration, columns $a_1$-$a_5$ and rows $b_1$-$b_2$ are shown separately in FIGS. 5 and 6, respectively.

Figure 4:
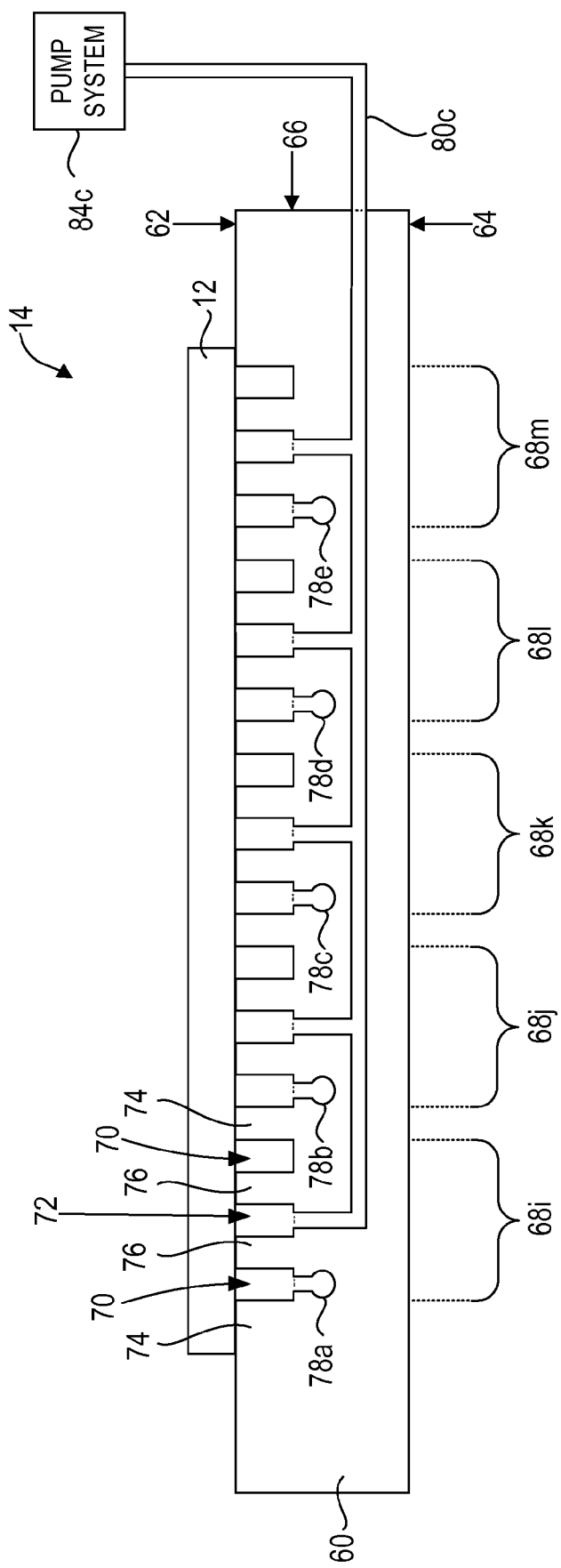
FIG. 4 is a side view of the substrate chuck shown in FIG. 1.
Figure 5:
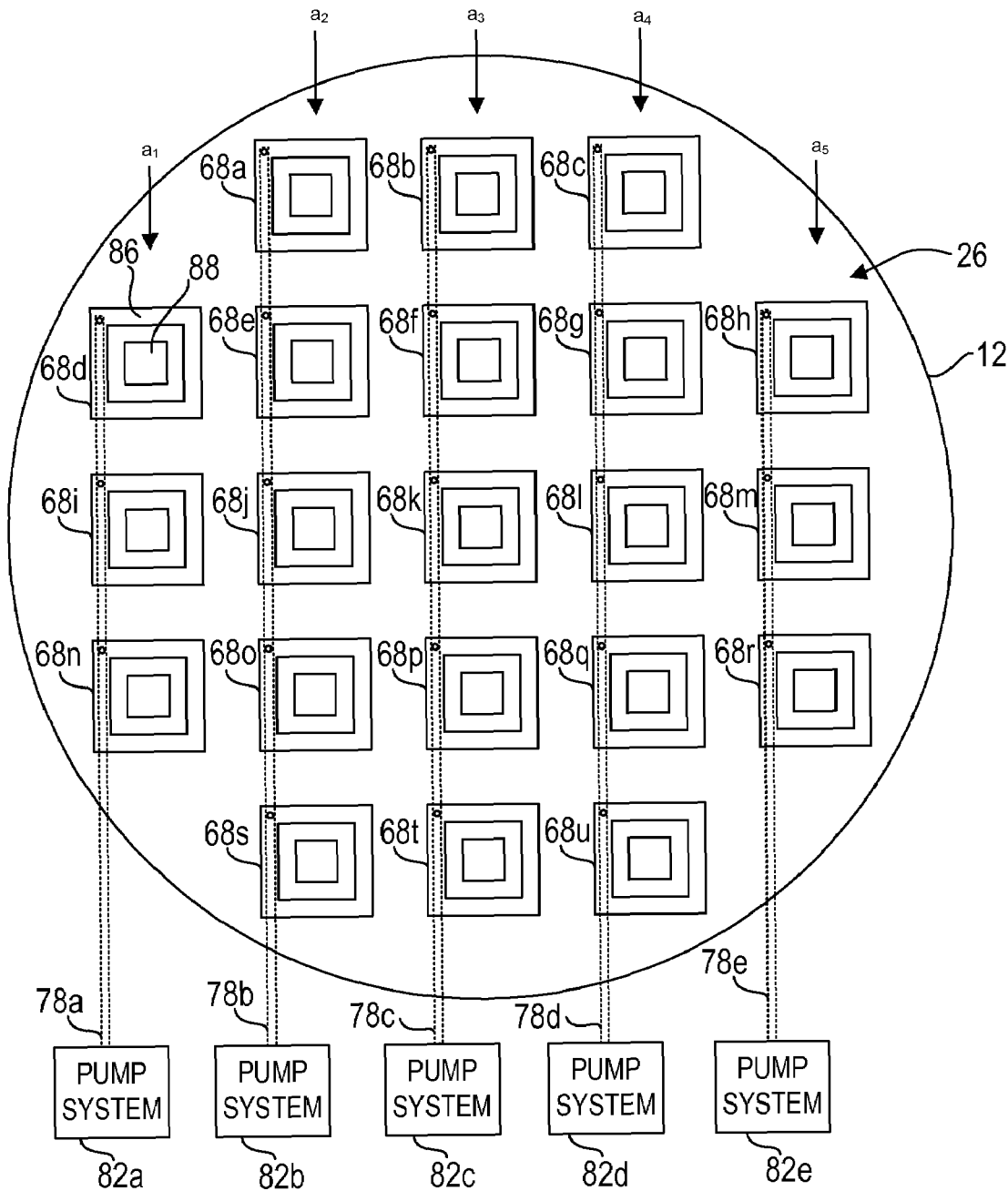
FIG. 5 is a top down view of the substrate chuck shown in FIG. 1, showing a plurality of columns of pump systems in fluid communication with a plurality of fluid chambers of the substrate chuck.
Figure 6:
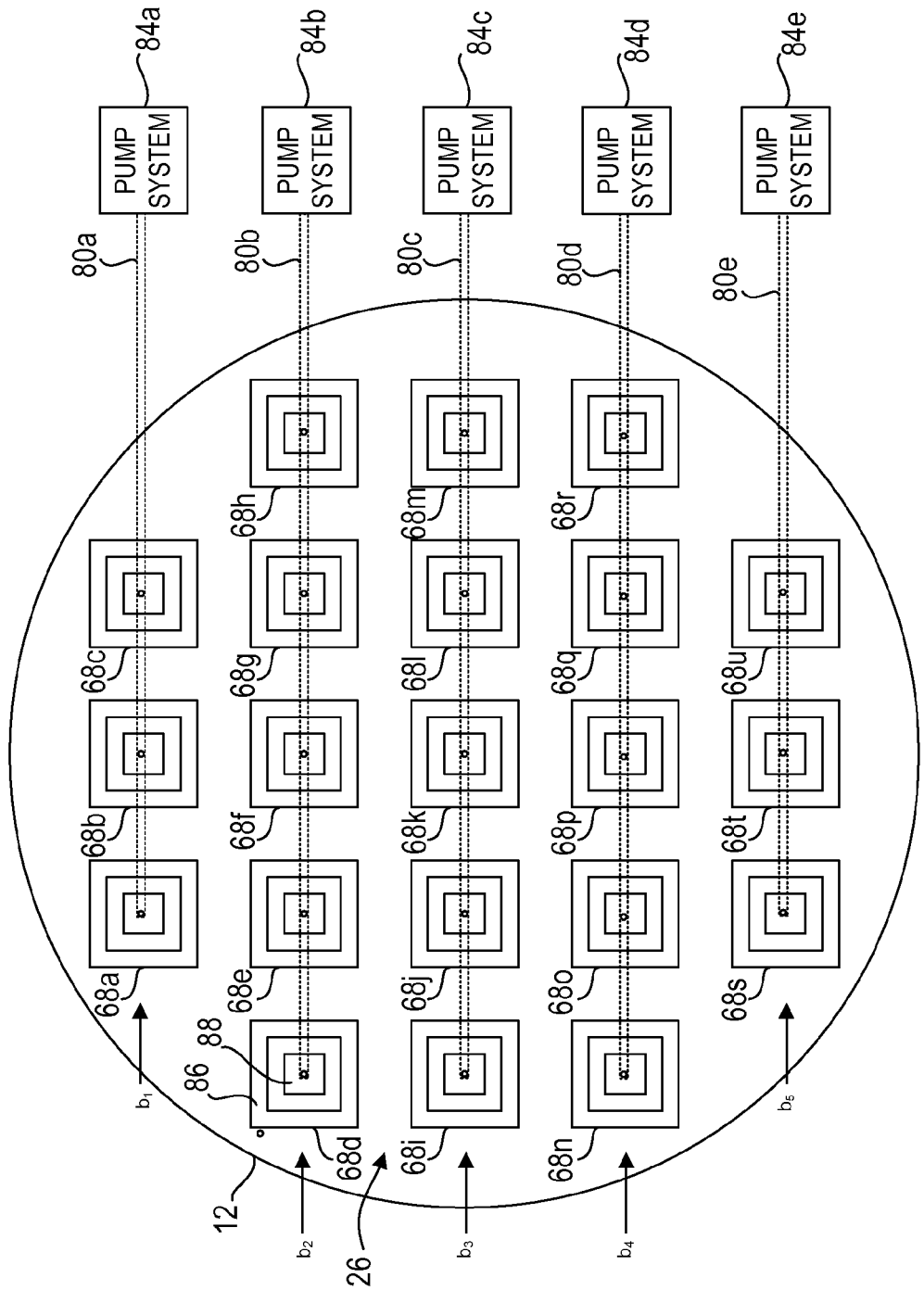
FIG. 6 is a top down view of the substrate chuck shown in FIG. 1, showing a plurality of rows of pump systems in fluid communication with a plurality of fluid chambers of the substrate chuck.

Referring to FIGS. 4-6, each of fluid chambers 68 comprises a first recess 70 and a second recess 72, spaced-apart from first recess 70, defining a support region 74 and a second support region 76. Second support region 76 cinctures second recess 72. First support region 74 cinctures second support region 76 and first and second recesses 70 and 72. Formed in chuck body 60 are a plurality of throughways 78 and 80 to place each of fluid chambers 68 in fluid communication with a pump system 82 and 84, respectively. More specifically, each first recess 70 of fluid chambers 68 may be in fluid communication with pump system 82 via throughway 78 and each second recess 72 may be in fluid communication with pump system 84 via throughway 80. Each of pump systems 82 and 84 may include one or more pumps therein.

Referring to FIGS. 4 and 5, each first recess 70 of fluid chambers 68 in a column $a_1$-$a_5$ of fluid chambers 68 may be in fluid communication with pump system 82 via throughway 78. More specifically, first recess 70 of fluid chambers 68$d$, 68$i$, and 68$n$ in column $a_1$ may be in fluid communication with a pump system 82$a$ via a throughway 78$a$; first recess 70 of fluid chambers 68$a$, 68$e$, 68$j$, 68$o$, and 68$s$ in column $a_2$ may be in fluid communication with a pump system 82$b$ via a throughway 78$b$; first recess 70 of fluid chambers 68$b$, 68$f$, 68$k$, 68$p$, and 68$t$ in column $a_3$ may be in fluid communication with a pump system 82$c$ via a throughway 78$c$; first recess 70 of fluid chambers 68$c$, 68$g$, 68$l$, 68$q$, and 68$u$ in column $a_4$ may be in fluid communication with a pump system 82$d$ via a throughway 78$d$; and first recess 70 of fluid chambers 68$h$, 68$m$, and 68$r$ in column $a_5$ may be in fluid communication with a pump system 82$e$ via a throughway 78$e$.

Referring to FIGS. 4 and 6, furthermore, each second recess 72 of fluid chambers 68 in a row $b_1$-$b_5$ may be in fluid communication with pump system 84 via throughway 80. More specifically, second recess 72 of fluid chambers 68$a$, 68$b$, and 68$c$ in row $b_1$ may be in fluid communication with a pump system 84$a$ via a throughway 80$a$; second recess 72 of fluid chambers 68$d$, 68$e$, 68$f$, 68$g$, and 68$h$ in row $b_2$ may be in fluid communication with a pump system 84$b$ via a throughway 80$b$; second recess 72 of fluid chambers 68$i$, 68$j$, 68$k$, 68$l$, and 68$m$ in row $b_3$ may be in fluid communication with a pump system 84$c$ via a throughway 80$c$; second recess 72 of fluid chambers 68$n$, 68$o$, 68$p$, 68$q$, and 68$r$ in row $b_4$ may be in fluid communication with a pump system 84$d$ via a throughway 80$d$; and second recess 72 of fluid chambers 68$s$, 68$t$, and 68$u$ may be in fluid communication with a pump system 84$e$ via a throughway 80$e$.

Referring to FIGS. 1 and 4-6, when substrate 12 is positioned upon substrate chuck 14, substrate 12 rests against first surface 62 of chuck body 60, covering fluid chambers 68, and more specifically, covering first and second recesses 70 and 72 of each of fluid chambers 68. More specifically, each first recess 70 of fluid chambers 68 and a portion of substrate 12 in superimposition therewith define a first chamber 86; and each second recess 72 of fluid chambers 68 and a portion of substrate 12 in superimposition therewith define a second chamber 88. Furthermore, pump system 82 operates to control a pressure/vacuum within first chamber 86 and pump system 84 operates to control a pressure/vacuum within second chamber 88. The pressure/vacuum within first chambers 86 and 88 may be established to maintain the position of substrate 12 to reduce, if not avoid, separation of substrate 12 from substrate chuck 14 while altering a shape of substrate 12, described further below. Pump systems 82 and 84 may be in data communication with processor 56, operating on a computer readable program stored in memory 58 to control pump systems 82 and 84.

Referring to FIGS. 4 and 5, more specifically, pump system 82a operates to control a pressure/vacuum within first chamber 86 of fluid chambers 68d, 68i, and 68n in column $a_1$; pump system 88b operates to control a pressure/vacuum within first chamber 86 of fluid chambers 68a, 68e, 68j, 68o, and 68s in column $a_2$; pump system 88c operates to control a pressure/vacuum within first chamber 86 of fluid chambers 68b, 68f, 68k, 68p, and 68t in column $a_3$; pump system 88d operates to control a pressure/vacuum within first chamber 86 of fluid chambers 68c, 68g, 68l, 68q, and 68u in column $a_4$; and pump system 88e operates to control a pressure/vacuum within first chamber 86 of fluid chambers 68h, 68m, and 68r in column $a_5$.

Referring to FIGS. 4 and 6, furthermore, pump system 84a operates to control a pressure/vacuum within second chamber 88 of fluid chambers 68a, 68b, and 68c in row $b_1$; pump system 84b operates to control a pressure/vacuum within second chamber 88 of fluid chambers 68d, 68e, 68f, 68g, and 68h in row $b_2$; pump system 84c operates to control a pressure/vacuum within second chamber 88 of fluid chambers 68i, 68j, 68k, 68l, and 68m in row $b_3$; pump system 84d operates to control a pressure/vacuum within second chamber 88 of fluid chambers 68n, 68o, 68p, 68q, and 68r in row $a_4$; and pump system 84e operates to control a pressure/vacuum within second chamber 88 of fluid chambers 68s, 68t, and 68u in row $b_5$.

Referring to FIGS. 4-7, each of fluid chambers 68 may have 1) a chucked state associated therewith or 2) a non-chucked/bowed state associated therewith, depending upon the application desired, described further below. More specifically, as mentioned above, first and second chambers 86 and 88 are associated with first and second recesses 70 and 72, respectively. To that end, a force exerted upon a portion of substrate 12 may be dependent upon, inter alia, a magnitude of the areas of first and second recesses 70 and 72 in superimposition with the portion of substrate 12 and a magnitude of the pressure/vacuum within first and second chambers 86 and 88 in superimposition with the portion of substrate 12. More specifically, for a portion 90 of substrate 12 in superimposition with a subset of fluid chambers 68, the force exerted upon portion 90 is a combination of a force $F_1$ exerted upon a sub-portion 92 of portion 90 in superimposition with first recess 70/first chamber 86 and a force $F_2$ exerted upon a sub-portion 94 of portion 90 in superimposition with second recess 72/second chamber 88. As shown, both force $F_1$ and $F_2$ are in a direction away from substrate 12. However, forces $F_1$ and $F_2$ may be in a direction towards substrate 12. Further, forces $F_1$ and $F_2$ may be in opposite directions. To that end, force $F_1$ exerted upon sub-portion 92 may be defined as follows:

$$F_1 = A_1 \times P_1 \quad (1)$$

where $A_1$ is the area of first recess 70 and $P_1$ is the pressure/vacuum associated with first chamber 86; and force $F_2$ exerted upon sub-portion 94 may be defined as follows:

$$F_2 = A_2 \times P_2 \quad (2)$$

where $A_2$ is the area of second recess 72 and $P_1$ is the pressure/vacuum associated with second chamber 88. Forces $F_1$ and $F_2$ associated with fluid chamber 68 may be referred to collectively as the chuck force $F_c$ exerted by substrate chuck 14 upon substrate 12.

Referring to FIGS. 1 and 4-6, to that end, it may be desired to have differing fluid chambers 68 have differing states therewith depending upon, inter alia, the spatial relationship between droplets 36, substrate 12, and mold 20. The state of first and second chambers 86 and 88 depend upon, inter alia, the direction of forces $F_1$ and $F_2$. More specifically, for force $F_1$ being in a direction towards substrate 12, first chamber 86 is in the pressure state; for force $F_1$ being in a direction away from substrate 12, first chamber 86 is in the vacuum state; for force $F_2$ being in a direction towards substrate 12, second chamber 88 is in the pressure state; and for force $F_2$ being in a direction away from substrate 12, second chamber 88 is in the vacuum state.

To that end, as a result of the possibility of first and second chambers 86 and 88 each having two differing states associated therewith, fluid chambers 68 may have one of four combinations associated therewith. Shown below in table 1 are the four combinations of vacuum/pressure within first and second chamber 86 and 88 and the resulting state of fluid chambers 68.

TABLE 1

| Combination | First Chamber 86 | Second Chamber 88 | State of Fluid Chamber 68 |
|---|---|---|---|
| 1 | Vacuum | Vacuum | Chucked |
| 2 | Vacuum | Pressure | Chucked |
| 3 | Pressure | Vacuum | Chucked |
| 4 | Pressure | Pressure | Non-Chucked/Bowed |

In the first and fourth combinations, first and second chambers 86 and 88 have the same state associated therewith. More specifically, in the first combination, first chamber 86 is in the vacuum state and second chamber 88 is in the vacuum state, and as a result, fluid chamber 68 has a chucked state associated therewith. Further, in the fourth combination, first chamber 86 is in the pressure state and second chamber 88 is in the pressure state, and as a result, fluid chamber 68 has a non-chucked/bowed state associated therewith.

In the second and third combinations, first and second chambers 86 and 88 have differing states associated therewith. However, fluid chamber 68 has a chucked state associated therewith. To that end, the ratio of the areas $A_1$ and $A_2$ of first and second recesses 70 and 72 is such that for a given pressure $K_p$ and a given vacuum $K_v$ associated with first and second chambers 86 and 88, a magnitude of a force of forces $F_1$ and $F_2$ associated with the vacuum state of first and second chambers 86 and 88 is greater than a magnitude of the force of the remaining forces $F_1$ and $F_2$ associated with the pressure state of first and second chambers 86 and 88. To that end, in the second combination mentioned above, first chamber 86 is in the vacuum state and second chamber 88 is in the pressure state.

For fluid chamber 68 to be in the vacuum state:

$$|F_1| > |F_2| \quad (3)$$

and thus, employing equations (1) and (2) mentioned above:

$$|A_1 \times K_v| > |A_2 \times K_p| \quad (4)$$

and thus the ratio of areas $A_1$ and $A_2$ of first and second recesses 70 and 72, respectively, is:

$$A_1/A_2 > |K_p/K_v| \tag{5}$$

In the third combination mentioned above, first chamber 86 is in the pressure state and second chamber 88 is in the vacuum state. To that end, for fluid chamber 68 to be in the vacuum state:

$$|F_2| > |F_1| \tag{6}$$

and thus, employing equations (1) and (2) mentioned above:

$$|A_2 \times K_v| > |A_1 \times K_p| \tag{7}$$

and thus the ratio of areas $A_1$ and $A_2$ of first and second recesses 70 and 72, respectively, is:

$$A_1/A_2 < |K_v/K_p|. \tag{8}$$

To that end, it is apparent for fluid chamber 68 to have a vacuum state associated therewith when first and second chambers 86 and 88 are in differing states, the areas $A_1$ and $A_2$ of first and second recesses 70 and 72, respectively, may be defined as follows:

$$|K_p/K_v| < A_1/A_2 < |K_v/K_p|. \tag{9}$$

In an example, $K_p$ may be approximately 40 kPa and $K_v$ may be approximately −80 kPa, and thus, the ratio of the areas $A_1$ to $A_2$ may be defined as follows:

$$0.5 < A_1/A_2 < 2. \tag{10}$$

Furthermore, a magnitude of the pressure within a fluid chamber 68 being in the non-chucked/bowed state may be varied. More specifically, processor 56, operating on a computer readable program stored in memory 58, may vary a magnitude of the pressure within first and second chambers 86 and 88 via pump systems 82 and 88, respectively, as a result of being in electrical communication with pump systems 82 and 84.

Referring to FIGS. 1-3, as mentioned above, a distance between mold 20 and substrate 12 is varied such that a desired volume is defined therebetween that is filled by polymeric material 34. Furthermore, after solidification, polymeric material 34 conforms to the shape of surface 46 of substrate 12 and patterning surface 22, defining patterning layer 48 on substrate 12. To that end, in a volume 96 defined between droplets 36 of matrix array 38, there are gases present. The gases and/or gas pockets may be such gases including, but not limited to, air, nitrogen, carbon dioxide, and helium. The gases between substrate 12 and mold 20 may result from, inter alia, a planarity of substrate 12 and mold 20. To that end, it may be desired to reduce the fill time, mentioned above, of mold 20. The fill time is dependent upon, inter alia, the time required for the gases and/or gas pockets between substrate 12 and mold 20 and within patterning layer 48 to evacuate from between substrate 12 and mold 20 and/or dissolve into polymeric material 34 and/or diffuse into polymeric material 34. To that end, a method and a system of minimizing, if not preventing, trapping of gas between mold 20 and substrate 12 are described below.

Figure 8:
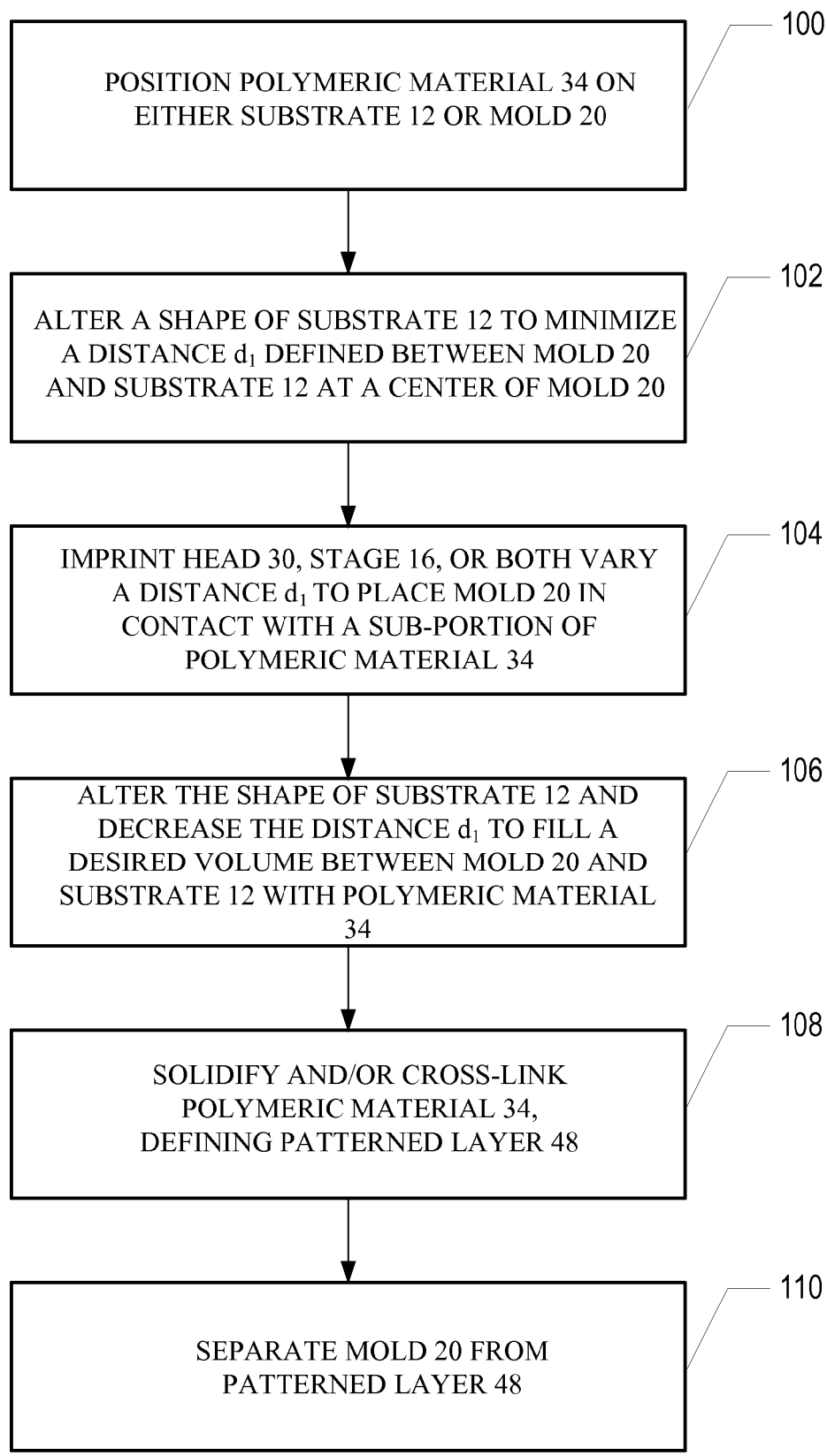
FIG. 8 is a flow diagram showing a method of patterning a region of the substrate shown in FIG. 1.

Referring to FIGS. 1 and 8, a method of expelling gas between substrate 12 and mold 20 is shown. More specifically, at step 100, as mentioned above, polymeric material 34 may be positioned on substrate 12 by drop dispense, spin-coating, dip coating, chemical vapor deposition (CVD), physical vapor deposition (PVD), thin film deposition, thick film deposition, and the like. In a further embodiment, polymer material 34 may be positioned on mold 20.

Referring to FIGS. 5, 6, 8, and 9, at step 102, a shape of substrate 12 may be altered such that a distance $d_1$ defined between mold 20 and substrate 12 at a center sub-portion of substrate 12 is less than a distance defined between mold 20 and substrate 12 at remaining portions of substrate 12. In an example, distance $d_1$ is less than a distance $d_2$, distance $d_2$ being defined at an edge of substrate 12. In a further embodiment, the distance $d_1$ may be defined at any desired location of substrate 12. The shape of substrate 12 may be altered by controlling a pressure/vacuum within the plurality of fluid chambers 68. More specifically, fluid chambers 68 in superimposition with a portion 98 of substrate 12 are in a non-chucked/bowed state to bow portion 98 of substrate 12 towards mold 20 and away from substrate chuck 14. Further, concurrently with fluid chambers 68 in superimposition with a portion 98 of substrate 12 being in the non-chucked/bowed state, the remaining fluid chambers 68 in superimposition with a portion 99 of substrate 12 are in a chucked state to retain substrate 12 upon substrate chuck 14.

Figure 7:
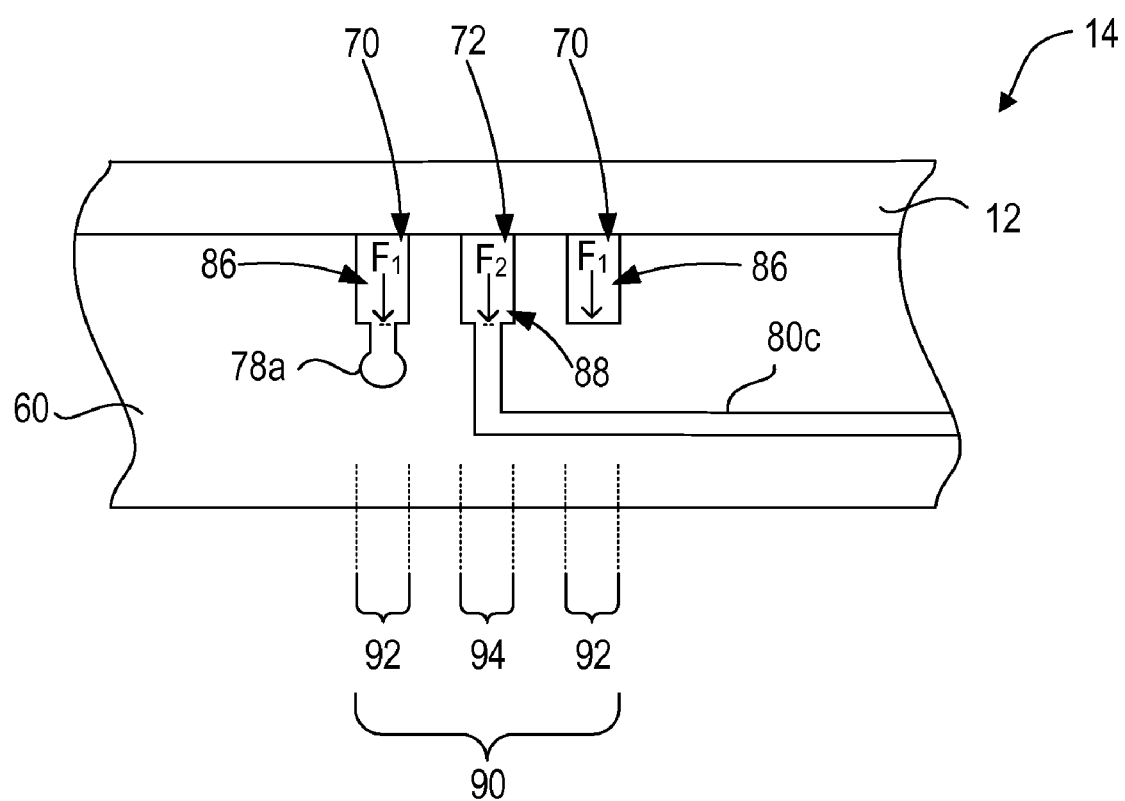
FIG. 7 is an exploded view of a portion of the substrate chuck and substrate, both shown in FIG. 1
Figure 9:
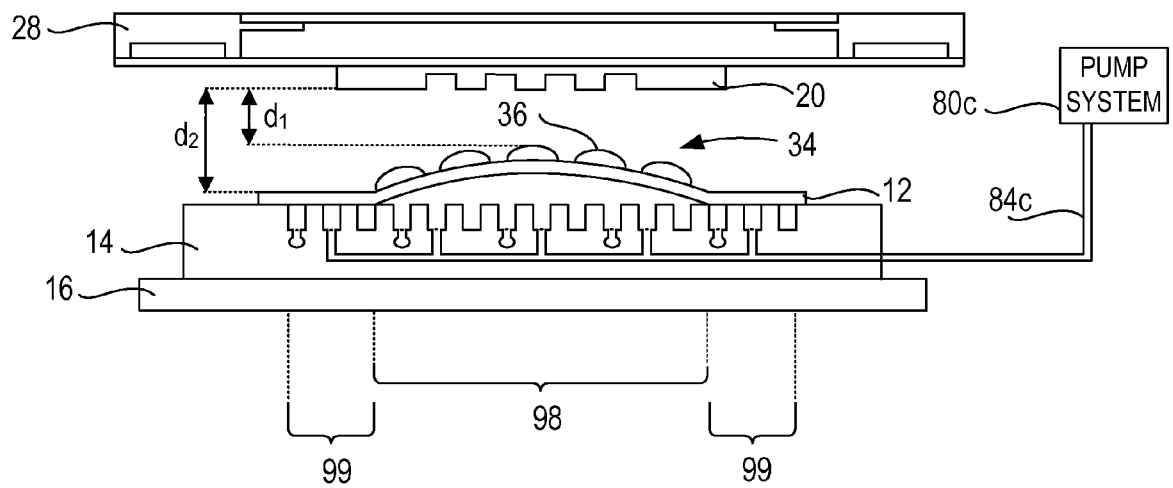
FIG. 9 is a side view of the mold and the substrate shown in FIG. 1, with a shape of the substrate being altered.
Figure 10:
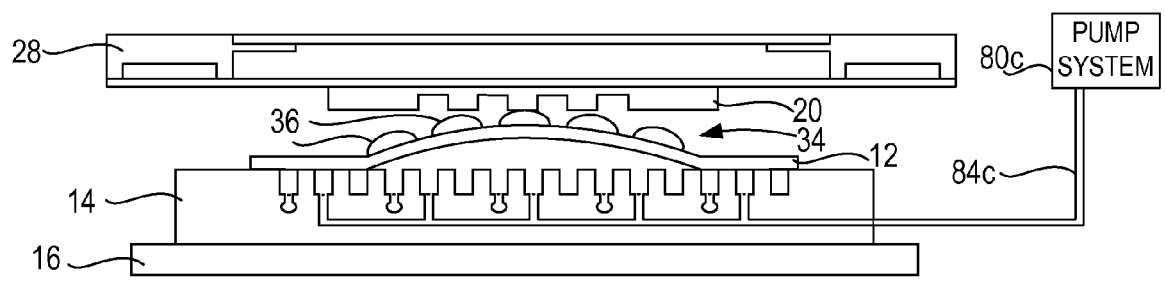
FIG. 10 is a side view of the mold and the substrate shown in FIG. 9, the mold being in contact with a portion of the droplets of imprint material shown in FIG. 2.
Figure 11:
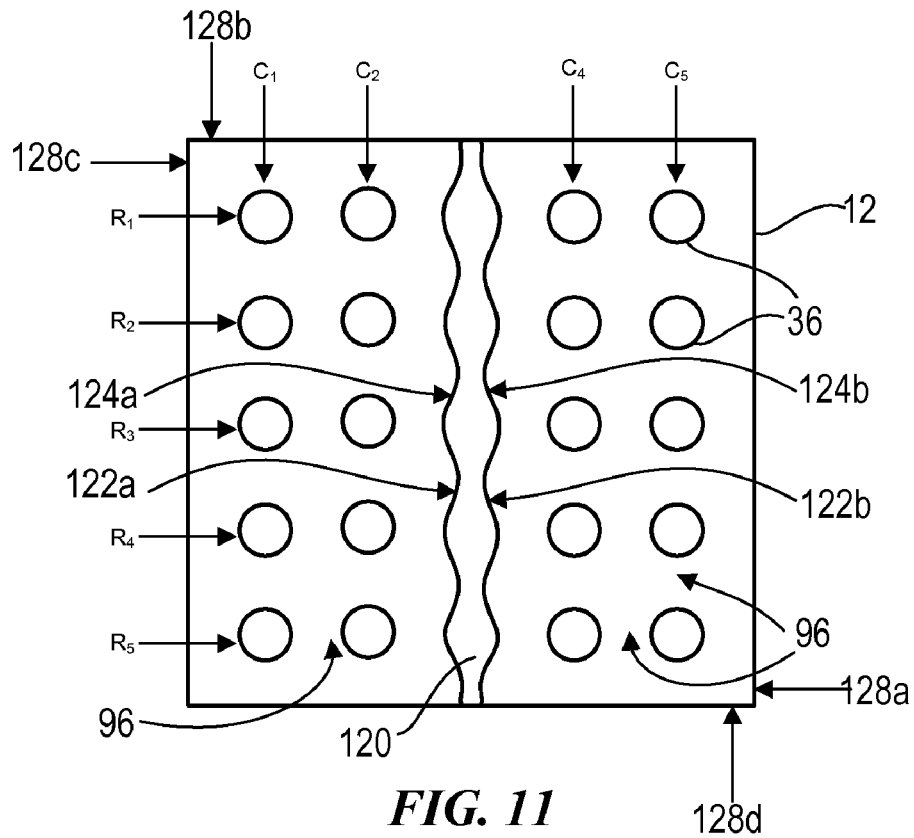
FIGS. 11-13 are top down views showing the compression of the droplets shown in FIG. 2, employing the altered shape of the substrate shown in FIG. 9.

Referring to FIGS. 7, 10, and 11, at step 104, as described above with respect to FIG. 1, either imprint head 30, shown in FIG. 1, stage 16, or both, may vary distance $d_1$, shown in FIG. 9, such that a sub-portion of mold 20 contacts a sub-portion of droplets 36. As shown, a center sub-portion of mold 20 contacts a sub-portion of droplets 36 prior to the remaining portions of mold 20 contacting the remaining droplets of droplets 36. However, in a further embodiment, any portion of mold 20 may contact droplets 36 prior to remaining portions of mold 20. To that end, as shown mold 20 contacts all of droplets 36 associated with column $C_3$, shown in FIG. 2, substantially concurrently. This causes droplets 36 to spread and produce contiguous liquid sheet 120 of polymeric material 34. Edges 122a and 122b of liquid sheet 120 define liquid-gas interfaces 124a and 124b, respectively, that function to push gases in volume 96 towards edges 128a, 128b, 128c, and 128d. Volume 96 between droplets 36 in columns $c_1$-$c_5$ define gas passages through which gas may be pushed to edges 128a, 128b, 128c, and 128d. As a result, liquid-gas interfaces 124a and 124b in conjunction with the gas passages reduces, if not prevents, trapping of gases in liquid sheet 120.

Figure 12:
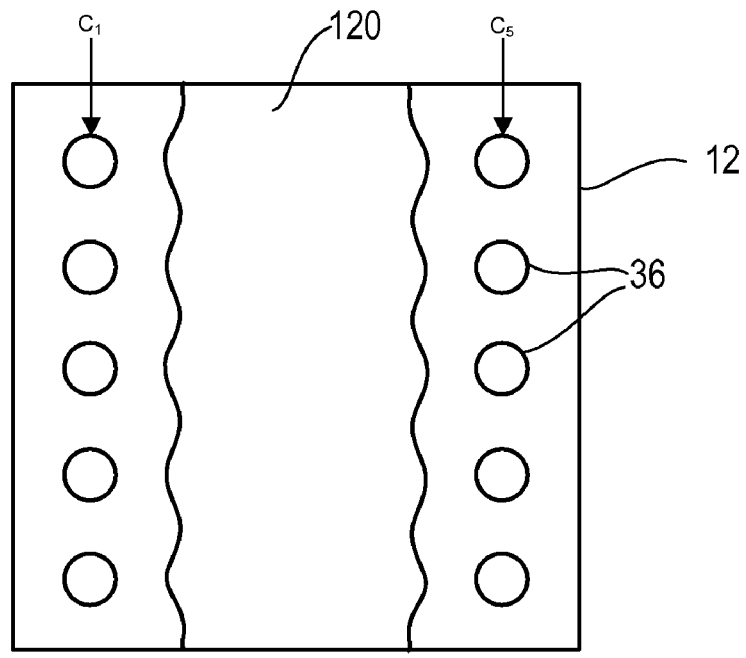
Figure 13:
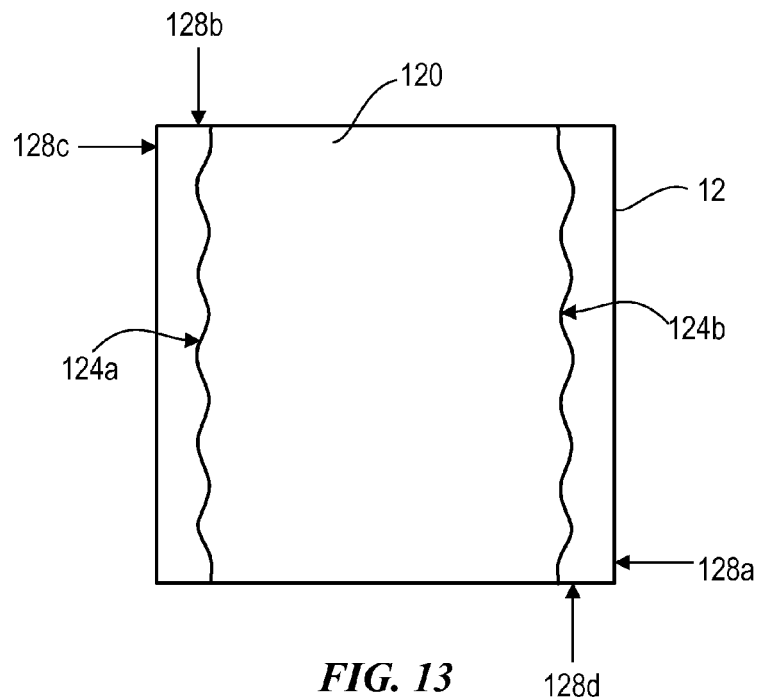
Figure 14:
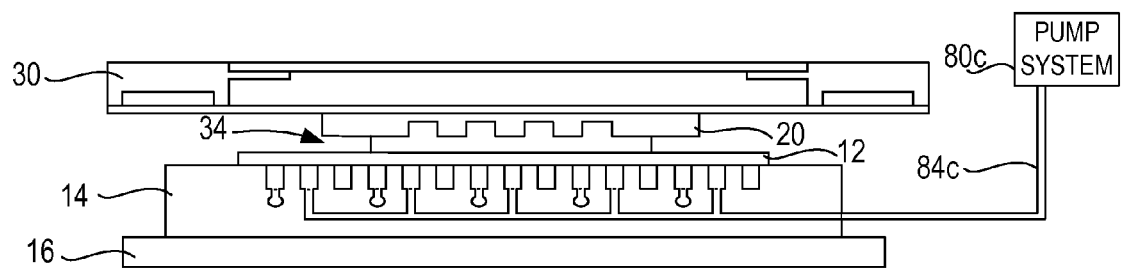
FIG. 14 is a side view of the mold and the substrate shown in FIG. 10, the substrate being positioned upon the substrate chuck.

Referring to FIGS. 4-6 and 8, at step 106, the shape of substrate 12 may be further altered as the distance $d_1$ is further reduced such that the desired volume defined between mold 20 and substrate 12 may be filled by polymeric material 34, as described above with respect to FIG. 1. More specifically, the shape of substrate 12 may be altered via fluid chambers 68 in combination with decreasing distance $d_1$ via imprint head 30, stage 16, or both. More specifically, as mentioned above, the magnitude of the pressure within first and second chambers 86 and 88 of fluid chambers 68 in superimposition with portion 98 of substrate 12, shown in FIG. 9, may be varied. To that end, as the distance $d_1$, shown in FIG. 9, is decreased, the magnitude of the pressure within first and second chambers 86 and 88 of fluid chambers 68 in superimposition with portion 98 of substrate 12, shown in FIG. 9, may be decreased. As a result of decreasing distance $d_1$, shown in FIG. 9, and decreasing the aforementioned pressure in first and second chambers 86 and 88 of the fluid chambers 68 in superimposition with portion 98 of substrate 12, shown in FIG. 9, polymeric material 34 associated with droplets 36 in column $c_2$ and $c_4$, shown in FIG. 2, spread to become included in contiguous fluid sheet 120, as shown in FIG. 12. Distance $d_1$, shown in FIG. 9, may be further reduced in combination with decreasing the magnitude of the pressure within first and second chambers 86 and 88 of fluid chambers 68 in superimposition with portion 98 of substrate 12, shown in FIG. 9, such that mold 20 subsequently comes into contact with droplets 36 associated with columns $c_1$ and $c_5$ such that polymeric material 34 associated therewith spreads to become included in contiguous sheet 120, as shown in FIG. 13. In a further embodiment, the pressure within first and second chambers 86 and 88 of fluid chambers 68 in superimposition with portion 98 of substrate 12 may be reduced such that portion 98 of substrate 12 is positioned upon substrate chuck 14, as shown in FIG. 14. In still a further embodiment, first and second chambers 86 and 88 of fluid chambers 68 in superimposition with portion 98 of substrate 12 may have a vacuum therein subsequent to spreading of droplets 36.

Referring to FIGS. 8 and 13, as can be seen, interfaces 124a and 124b have moved towards edges 128c and 128a, respectively, so that there is an unimpeded path for the gases in the remaining volume 96, shown in FIG. 11, to travel thereto. This allows gases in volume 96, shown in FIG. 11, to egress from between mold 20 and substrate 12 vis-à-vis edges 128a, 128b, 128c, and 128d. In this manner, the trapping of gases and/or gas pockets between substrate 12 and mold 20 and within patterning layer 48, show in FIG. 3, is minimized, if not prevented.

Referring to FIGS. 1 and 8, at step 108, as mentioned above with respect to FIG. 1, polymeric material 34 may be then solidified and/or cross-linked, defining patterned layer 48, shown in FIG. 3. Subsequently at step 110, mold 20 may be separated from patterned layer 48.

Figure 15:
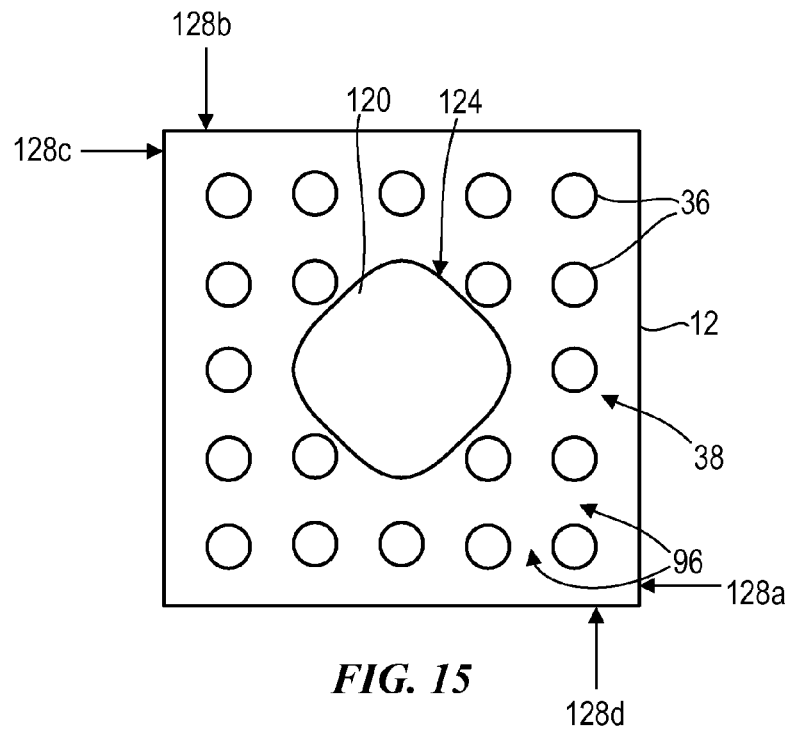
FIG. 15 is a top down view showing the compression of the droplets in FIG. 2, employing the altered shape of the substrate shown in FIG. 10, in a further embodiment.

Referring to FIGS. 1, 8 and 15, as described above, the shape of substrate 12 may be altered along a first direction. However, in a further embodiment, the shape of substrate 12 may be altered concurrently in first and second directions, with the second direction extending orthogonal to the first direction. More specifically, substrate 12 may be altered such that a center sub-portion of substrate 12 contacts mold 20, and thus, a center sub-portion of droplets 36 contacts mold 20 prior to the remaining droplets of droplets 36 contacting mold 20, as described above with respect to FIG. 10. This causes droplets 36 to spread and to produce contiguous liquid sheet 120 of polymeric material 34, defining continuous liquid-gas interface 124 that functions to push gases in volume 96 outward radially. In an example, liquid sheet 120 may have a circular or circular-like expansion of liquid-gas interface 124 to push gases in volume 96 towards edges 128a, 128b, 128c, and 128d outward radially. However, in a further embodiment, the shape of substrate 12 may be altered in any direction to produce liquid sheet 120 with any geometric shape, i.e. spherical, cylindrical, etc., desired to facilitate pushing gases in volume 96 towards edges 128a, 128b, 128c, and 128d outward radially to minimize, if not prevent, trapping of gas and/or gas pockets between substrate 12 and mold 120 and within patterning layer 48, as shown in FIG. 3. In a further embodiment, a subset of rows or columns of first and second chambers 86 and 88, respectively, may be have no pressure/vacuum created therein.

Figure 16:
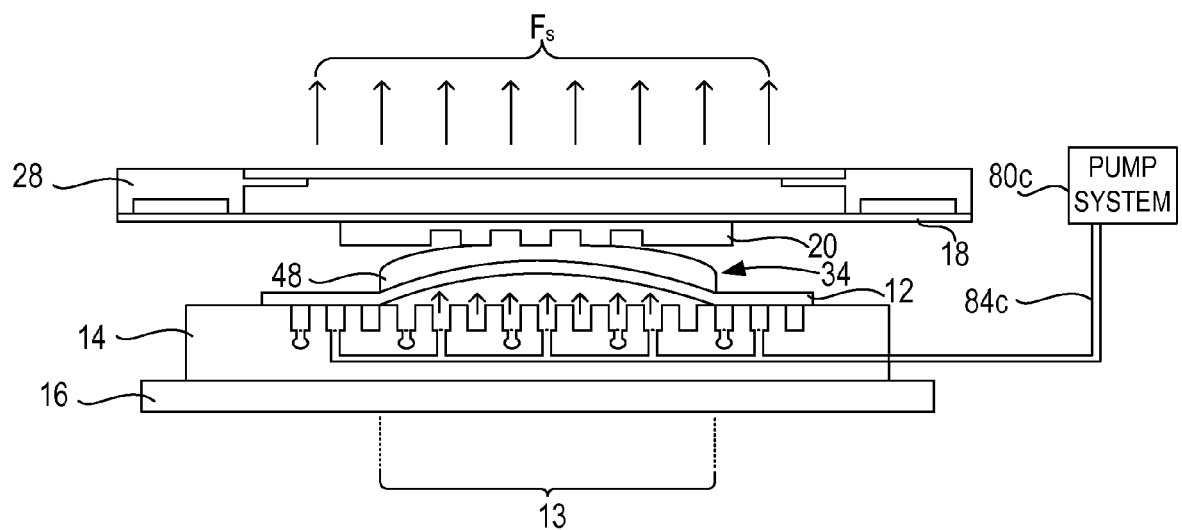
FIG. 16 is a side view of the mold and the substrate shown in FIG. 1, the mold being partially separated from the substrate.

Referring to FIG. 16, in a further embodiment, substrate chuck 14 may be further employed to facilitate separation between mold 20 and patterned layer 48 positioned upon substrate 12. More specifically, separation of mold 20 from patterned layer 48 is achieved by application of a separation force $F_s$ to template 18 and mold 20. Separation force $F_s$ is of sufficient magnitude to overcome adhesion forces between mold 20 and patterned layer 48 and the resistance of substrate 12 to strain (deformation). It is believed that deformation of a portion of substrate 12 facilitates separation of mold 20 from patterned layer 48. To that end, it may be desired to minimize a magnitude of the separation force $F_s$ to achieve separation of mold 20 from patterned layer 48. Minimizing the magnitude of the separation force $F_s$ may, inter alia, facilitate alignment between mold 20 and substrate 12, increase a ratio of template patterning area versus total template area, and minimize probability of structural compromise of template 18, mold 20, substrate 12, and patterned layer 48.

To that end, as mentioned above, a magnitude of the pressure within fluid chambers 68 may be varied. To that end, during separation of mold 20 from patterned layer 48, fluid chambers 68 in superimposition with a portion 13 of substrate 12 may be in the non-chucked/bowed state. As a result, fluid chambers 68 in superimposition with portion 13 of substrate 12 may exert chuck force $F_c$, forces $F_1$ and $F_2$, shown in FIG. 7, in substantially the same direction as the direction of the separation force $F_s$. As a result, the magnitude of the separation force $F_s$ required to separate mold 20 from patterned layer 48 may be reduced. More specifically, the magnitude of chuck force $F_c$ in superimposition with portion 13 of substrate 12 is established to facilitate strain (deformation) of portion 13 of substrate 12 in response to separation force $F_s$. It should be noted that the magnitude of chuck force $F_c$ in superimposition with portion 13 of substrate 12 may have any value desired such that portions of substrate 12 outside of portion 13 are retained upon substrate chuck 14 when the same is subjected to separation force $F_s$.

Referring to FIG. 1, in still a further embodiment, the above-mentioned method of bending of substrate 12 via substrate chuck 14 may be analogously applied to template 18/mold 20. More specifically, template 18/mold 20 may be positioned upon substrate chuck 14 to facilitate bending thereof in substantially the same method as described above with respect to substrate 12. To that end, template 18/mold 20 may have a thickness of 1 mm to facilitate bending thereof. In still a further embodiment, substrate 12 may be altered employing a plurality of actuators in lieu of, or in combination with, substrate chuck 14.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A chucking system to hold a first portion of a substrate and simultaneously bow a second portion of the substrate, comprising:

a chuck body having first and second opposed sides, the first side including an array of fluid chambers arranged in rows and columns, the array of fluid chambers including a first fluid chamber in superimposition with the first portion of the substrate and a second fluid chamber in superimposition with the second portion of the substrate, each fluid chamber comprising first and second spaced-apart recesses defining first and second spaced-apart support regions, with the first support region cincturing the second support region and the first and second recesses, and the second support region cincturing the second recess, with the substrate capable of resting against the first and second support regions, such that the first recess and a portion of the substrate in superimposition therewith define a first chamber and the second recess and a portion of the substrate in superimposition therewith define a second chamber, with each of the first chambers and each of the second chambers being in fluid communication with a differing source of fluid to control a flow of fluid in the array of fluid chambers, the first chamber of the first fluid chamber in a vacuum state and wherein the second chamber of the first fluid chamber and the first chamber and the second chamber of the second fluid chamber in a pressure state.

2. The chucking system as recited in claim 1 wherein each first chamber in a column of the fluid chambers is in fluid communication with a common fluid source.

3. The chucking system as recited in claim 1 wherein each second chamber in a row of the fluid chambers is in fluid communication with a common fluid source.

4. The chucking system as recited in claim 1 wherein each first chamber in a column of the fluid chambers is in fluid communication with a first common fluid source and wherein each second chamber in a row of the fluid chambers is in fluid communication with a second common fluid source differing from the first common fluid source.

5. The chucking system as recited in claim 1 wherein a fluid chamber of the array of fluid chambers is sealed from the remaining fluid chambers of the array of fluid chambers.

6. The chucking system as recited in claim 1 further including a plurality of throughways, with each column of the first chambers and each row of the second chambers being coupled to differing throughways to place the first and second chambers in fluid communication with the differing source of fluid.

7. A chucking system to hold a substrate a first portion of a substrate and simultaneously bow a second portion of the substrate, the system comprising:
a chuck body having first and second opposed sides, the first side including an array of fluid chambers including a first fluid chamber and a second fluid chamber, each fluid chamber comprising first and second spaced-apart recesses, defining first and second spaced-apart support regions, with the first support region cincturing the second support region and the first and second recesses, and the second support region cincturing the second recess, with the substrate capable of resting against the first and second support regions such that the first recess and a portion of the substrate in superimposition therewith define a first chamber and the second recess and a portion of the substrate in superimposition therewith define a second chamber; and
a pressure control system in fluid communication with the first fluid chamber and the second fluid chamber, the pressure control system in fluid communication with each of the first and second chambers of the first fluid chamber and the second fluid chambers to control a pressure within the first and second chambers such that the first and second chambers of the first fluid chamber have a positive pressure therein and the the first and second chambers of the second fluid chamber have a negative pressure therein, wherein for a given positive pressure within the first and second chambers of the first fluid chamber and a negative pressure within the first and second chambers of the second fluid chamber, a ratio of an area between the first and second recesses is such that the first fluid chamber exerts a negative force upon a portion of the substrate in superimposition with the fluid chamber.

8. The chucking system as recited in claim 7 further including a plurality of fluid chambers arranged in rows and columns.

9. The chucking system as recited in claim 7 further including a first and second throughways to place the first and second chambers of the first fluid chamber, respectively, in fluid communication with the pressure control system.

10. The chucking system as recited in claim 8 wherein the pressure control system comprises a plurality of sources of fluid, with each column of the first chambers and each row of the second chambers are in fluid communication with a differing source of fluid of the plurality of sources of fluid to control a flow of fluid in the array of fluid chambers.

11. The chucking system as recited in claim 10 wherein each first chamber in a column of the fluid chambers is in fluid communication with a common fluid source.

12. The chucking system as recited in claim 10 wherein each second chamber in a row of the fluid chambers is in fluid communication with a common fluid source.

13. The chucking system as recited in claim 10 wherein each first chamber in a column of the fluid chambers is in fluid communication with a first common fluid source and wherein each second chamber in a row of the fluid chambers is in fluid communication with a second common fluid source differing from the first common fluid source.

14. The chucking system as recited in claim 10 wherein a fluid chamber of the array of fluid chambers is sealed from the remaining fluid chambers of the array of fluid chambers.

15. The chucking system as recited in claim 10 further including a plurality of throughways, with each column of the first chambers and each row of the second chambers being coupled to differing throughways to place the first and second chambers in fluid communication with the differing source of fluid.

16. A chucking system to hold a first portion of a substrate and simultaneously bow a second portion of a substrate, the system comprising:
a chuck body having first and second opposed sides, the first side including an array of fluid chambers arranged in rows and columns, the array of fluid chambers including a first fluid chamber and a second fluid chamber, each of the first fluid chamber and the second fluid chamber comprising first and second spaced-apart recesses, defining first and second spaced-apart support regions, with the first support region cincturing the second support region and the first and second recesses, and the second support region cincturing the second recess, with the substrate resting against the first and second support regions, with the first recess and a portion of the substrate in superimposition therewith defining a first chamber and the second recess and a portion of the substrate in superimposition therewith defining a second chamber; and
a pressure control system having a plurality of sources of fluid, with each column of the first chambers and each row of the second chambers being in fluid communication with a differing source of fluid of the plurality of sources of fluid, the pressure control system controlling a pressure within the first and second chambers such that the first and second chambers of the first fluid chamber has a positive pressure therein and the of the first and second chambers of the second fluid chamber has a negative pressure therein, wherein for a given positive pressure within the first and second chambers of the first fluid chamber and a negative pressure the first and second chambers of the second fluid chamber, a ratio of an area between the first and second recesses is such that the first fluid chamber exerts a negative force upon a portion of the substrate in superimposition with the first fluid chamber.

17. The chucking system as recited in claim 16 wherein each first chamber in a column of the fluid chambers is in fluid communication with a common fluid source.

18. The chucking system as recited in claim 16 wherein each second chamber in a row of the fluid chambers is in fluid communication with a common fluid source.

19. The chucking system as recited in claim 16 wherein each first chamber in a column of the fluid chambers is in fluid communication with a first common fluid source and wherein each second chamber in a row of the fluid chambers is in fluid communication with a second common fluid source differing from the first common fluid source.

20. The chucking system as recited in claim 16 further including a plurality of throughways, with each column of the first chambers and each row of the second chambers being coupled to differing throughways to place the first and second chambers in fluid communication with the differing source of fluid.

* * * * *